(12) United States Patent
Anderson et al.

(10) Patent No.: US 7,833,907 B2
(45) Date of Patent: Nov. 16, 2010

(54) CMP METHODS AVOIDING EDGE EROSION AND RELATED WAFER

(75) Inventors: Felix P. Anderson, Colchester, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 272 days.

(21) Appl. No.: 12/107,980

(22) Filed: Apr. 23, 2008

(65) Prior Publication Data

US 2009/0267192 A1   Oct. 29, 2009

(51) Int. Cl.
*H01L 21/461* (2006.01)
(52) U.S. Cl. .................. 438/692; 257/E21.438; 438/690; 438/974
(58) Field of Classification Search .......... 257/E21.438; 438/690, 974
See application file for complete search history.

(56) References Cited

U.S. PATENT DOCUMENTS

| | | | |
|---|---|---|---|
| 6,268,289 B1 | 7/2001 | Chowdhury et al. | |
| 6,506,098 B1 | 1/2003 | Ho et al. | |
| 6,632,292 B1 | 10/2003 | Aegerter et al. | |
| 6,709,721 B2 | 3/2004 | Rocha-Alvarez et al. | |
| 6,884,155 B2 | 4/2005 | Sung et al. | |
| 6,893,505 B2 | 5/2005 | Peace | |
| 7,048,837 B2 | 5/2006 | Somekh et al. | |
| 7,060,624 B2 | 6/2006 | Andricacos et al. | |
| 7,074,710 B2 | 7/2006 | Whitefield et al. | |
| 7,102,763 B2 | 9/2006 | Ritzdorf et al. | |
| 7,201,645 B2 | 4/2007 | Sung | |
| 7,265,027 B2 | 9/2007 | Yang | |
| 7,402,520 B2 * | 7/2008 | Donohoe et al. ............ 438/690 |
| 2002/0160610 A1 * | 10/2002 | Arai et al. ................... 438/692 |
| 2007/0155133 A1 * | 7/2007 | Richter et al. ............... 438/465 |

* cited by examiner

*Primary Examiner*—Asok K Sarkar
(74) *Attorney, Agent, or Firm*—Anthony Canale; Hoffman Warnick LLC

(57) ABSTRACT

Methods of avoiding chemical mechanical polish (CMP) edge erosion and a related wafer are disclosed. In one embodiment, the method includes providing a wafer; forming a first material across the wafer; forming a second material at an outer edge region of the wafer, leaving a central region of the wafer devoid of the second material; and performing chemical mechanical polishing (CMP) on the wafer. The second material diminishes CMP edge erosion.

19 Claims, 8 Drawing Sheets

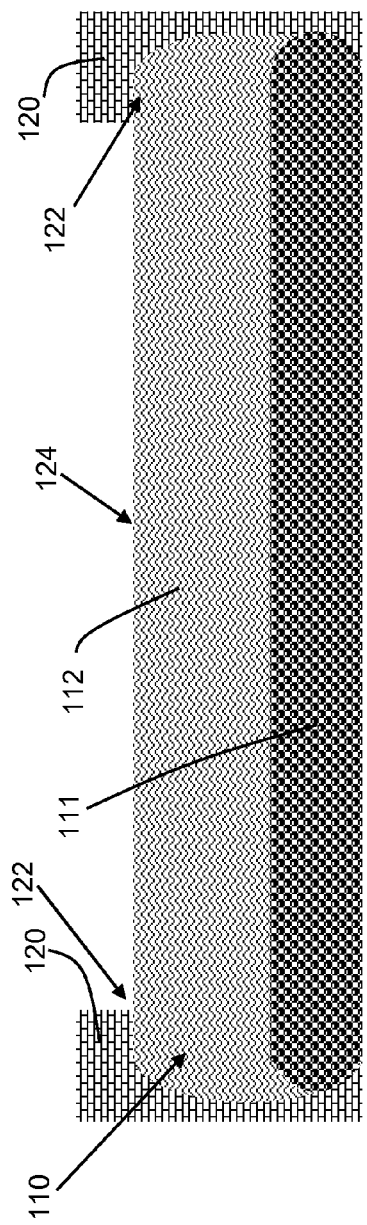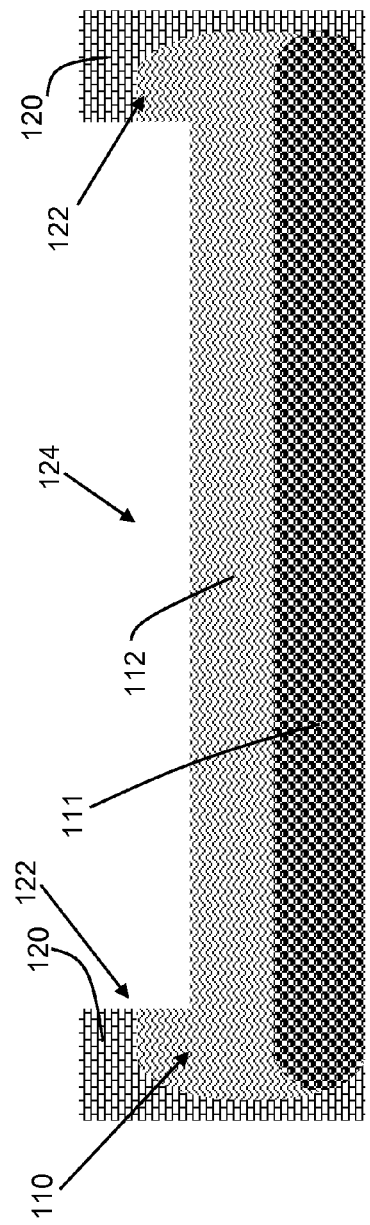

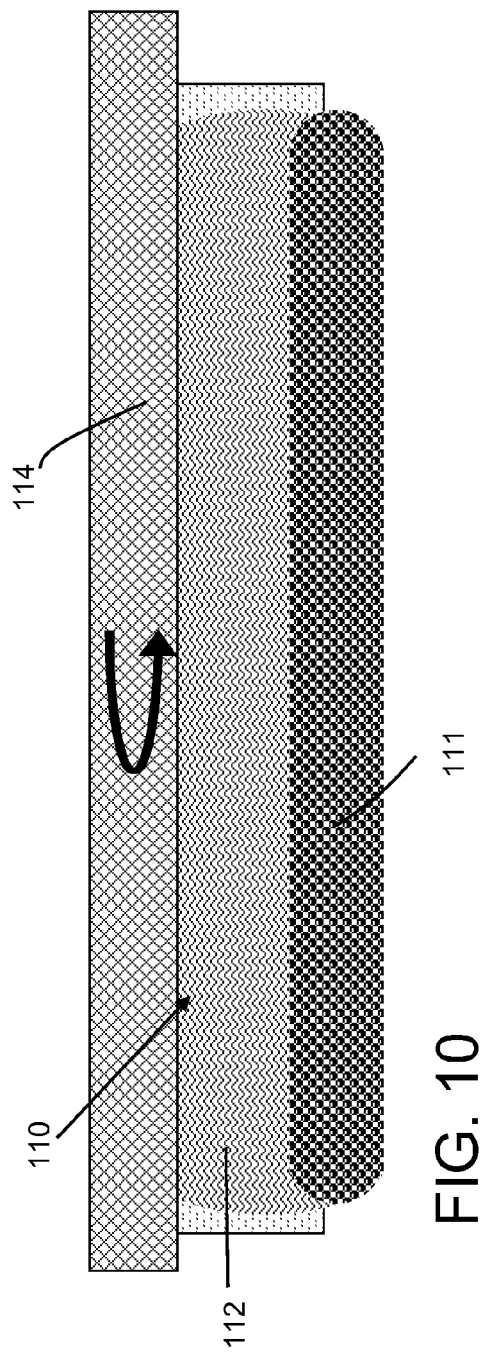
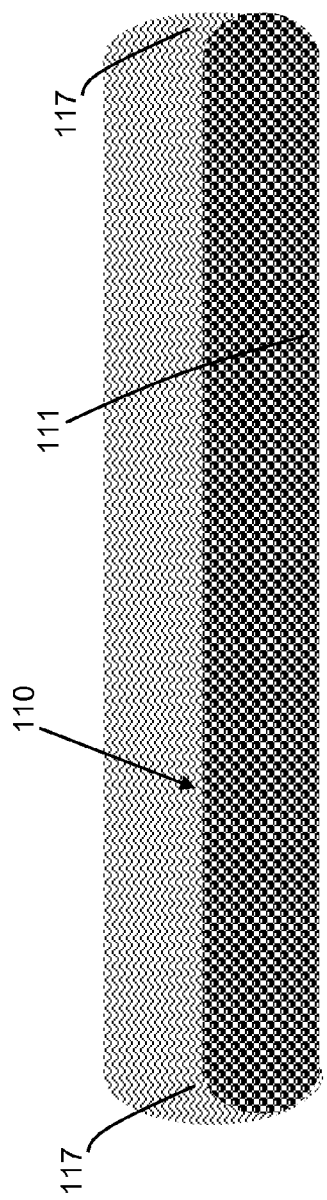

CMP METHODS AVOIDING EDGE EROSION AND RELATED WAFER

BACKGROUND

The disclosure relates generally to integrated circuit (IC) chip fabrication, and more particularly, to chemical mechanical polishing (CMP).

BACKGROUND ART

Chemical mechanical polishing (CMP) is used for practically all wiring levels during integrated circuit (IC) chip fabrication. CMP includes rotating a pad in a slurry including abrasives to planarize a surface and/or define conductive interconnect patterns of a wafer. FIG. 1 shows a typical wafer 10 having a dielectric or conductor layer 12 (simplified for illustrative purposes) thereon requiring CMP processing. As shown in FIGS. 2A-B, centrifugal forces caused by a spinning pad 14 significantly increase a CMP rate at an edge 16 of wafer 10, i.e., abrasives (not shown) congregate towards edge 16 due to centrifugal forces and increase the polishing rate. The increased CMP rate results in erosion of the underlying films and exposure of underlying material (e.g., silicon) on the wafer edge and bevel 17 as shown in FIG. 2B. (FIG. 2B is exaggerated for illustrative purposes). The exposure of the wafer edge/bevel can result in, for example, poor adhesion of subsequent films (e.g., silicon nitride, refractory metals, etc.), which can flake off and block damascene wire/via patterns, which results in wire and via opens. In addition, the increased polish rate at the wafer edge results in shorter via or contact height, for dielectric CMP; or increased dishing or erosion of damascene oxide metal features.

SUMMARY

Methods of reducing chemical mechanical polish (CMP) edge erosion and a related wafer are disclosed. In one embodiment, the method includes providing a wafer; forming a first material across the wafer; forming a second material at an outer edge region of the wafer, leaving a central region of the wafer devoid of the second material; and performing chemical mechanical polishing (CMP) on the wafer. The second material diminishes CMP edge erosion.

A first aspect of the disclosure provides a method comprising: providing a wafer; forming a first material across the wafer; forming a second material at an outer edge region of the wafer, leaving a central region of the wafer devoid of the second material; and performing chemical mechanical polishing (CMP) on the wafer.

A second aspect of the disclosure provides a method comprising: providing a wafer; forming a first material across the wafer; forming a photoresist at an outer edge region of the wafer that is less than approximately 2 millimeter in width, leaving a central region of the wafer devoid of the photoresist; performing chemical mechanical polishing (CMP) on the wafer; and removing the photoresist from the outer edge region.

A third aspect of the disclosure provides a wafer comprising: a plurality of integrated circuit (IC) chips formed in a substrate having an outer edge and a bevel, the substrate further comprising an upper surface made planar by polishing; and a dielectric material on at least one of the outer edge or the bevel of the substrate.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 3-5 show embodiments of a process with FIGS. 3A-B showing embodiments of a wafer according to the disclosure.

FIGS. 8-11 show another alternative embodiment of the process.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
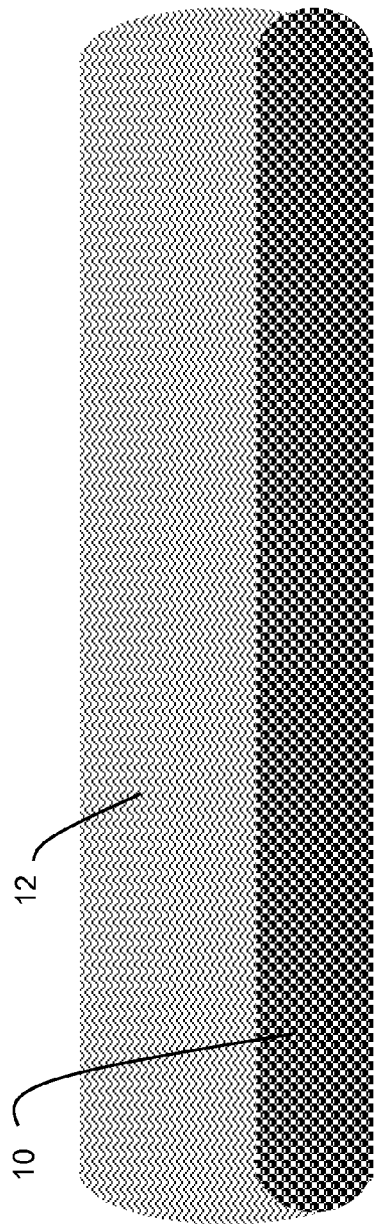
FIGS. 1-2A-B show a conventional CMP process.
Figure 2A:
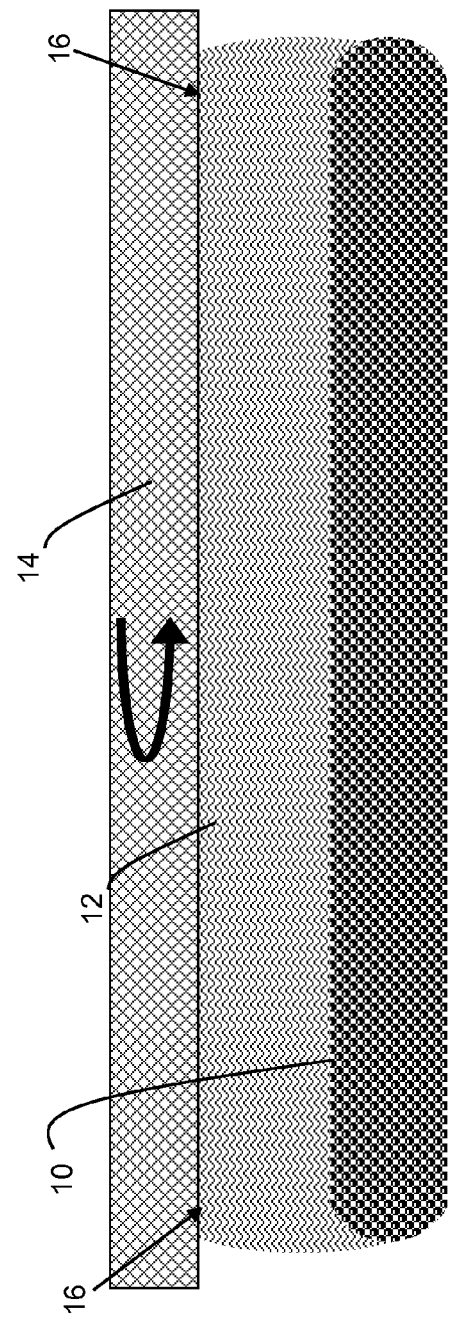
Figure 2B:
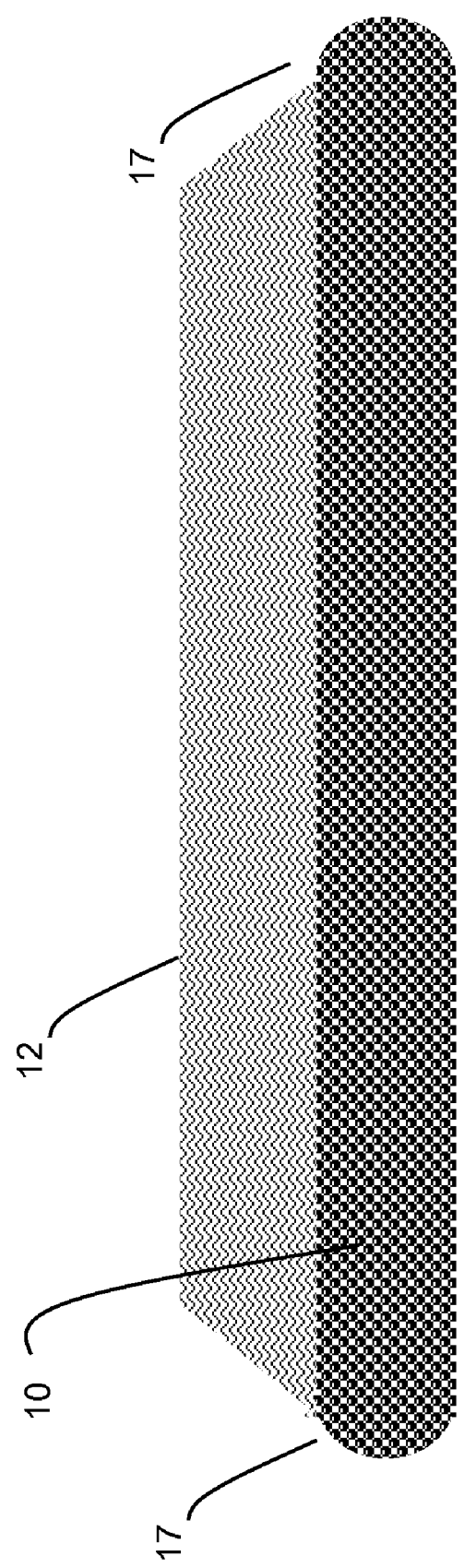
Figure 4:
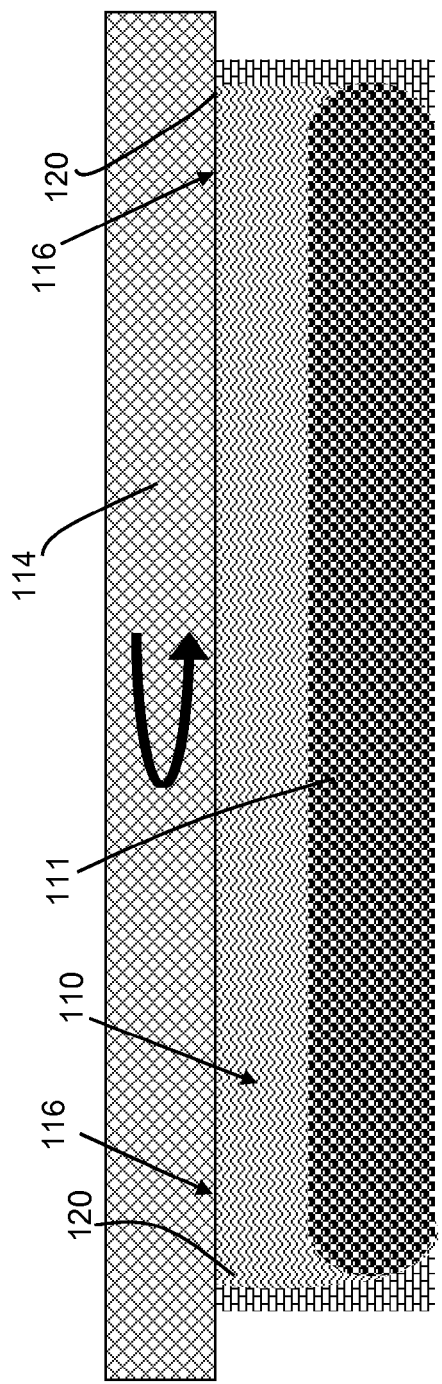
Figure 5:
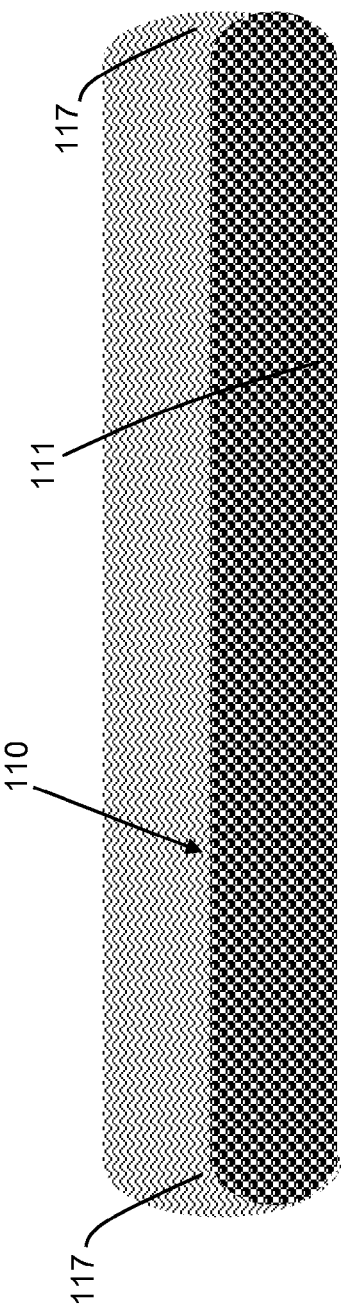

The present disclosure includes methods and a wafer for addressing wafer edge CMP problems. The teachings of the disclosure may be applied at practically any Damascene level including front-end-of-the-line (FEOL) (i.e., shallow trench isolation, deep trench silicon capacitors, damascene FET gates, etc.) middle-of-the-line (MOL) (i.e., pre-metal-dielectric, damascene tungsten stud contacts, etc.), or back-end-of-line (BEOL) (i.e., after first metal level such as inter-metal dielectric, damascene tungsten stud vias, damascene copper wires, damascene passive elements, etc.) layers. Referring to FIGS. 3-5 embodiments of a method and wafer according to the disclosure are illustrated.

In a first process, shown in FIGS. 3A-B, a wafer 110 is provided. Wafer 110 may be any now known or later developed type of wafer used in IC fabrication and may include any previously formed layers. That is, wafer 110 may include an underlying substrate 111 and any number of layers previously formed thereon.

FIGS. 3A-B also show forming a first material 112 across wafer 110. First material 112 may include, for example, a dielectric or a conductor. A dielectric may include but is not limited to: silicon nitride ($Si_3N_4$), silicon dioxide ($SiO_2$), fluorinated $SiO_2$ (FSG), hydrogenated silicon oxycarbide (Si-COH), porous SiCOH, boro-phospho-silicate glass (BPSG), phospho-silicate glass (PSG), silsesquioxanes, carbon (C) doped oxides (i.e., organosilicates) that include atoms of silicon (Si), carbon (C), oxygen (O), and/or hydrogen (H), thermosetting polyarylene ethers, SiLK™ (a polyarylene ether available from Dow Chemical Corporation), a spin-on silicon-carbon containing polymer material available form JSR Corporation, or other dielectric materials used in IC fabrication, or layers thereof. A conductor may include but is not limited to: copper (Cu), aluminum (Al), ruthenium (Ru), tantalum (Ta), titanium (Ti), tungsten (W), iridium (Ir), rhodium (Rh) and platinum (Pt), etc., or other conductors used in IC fabrication, or mixtures thereof. First material 112 may be substantially uniformly deposited, and may fill trenches or other topography of wafer 110, which is not shown for clarity. "Depositing" may include any now known or later developed techniques appropriate for the material to be deposited including but are not limited to, for example:

chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIGS. 3A-B also show forming a second, sacrificial material 120 at an outer edge region 122 of wafer 110, leaving a central region 124 of wafer 110 devoid of the second material. Second material 120 may include, for example, a dielectric or a conductor. Outer edge region 122 is less than the 'edge exclusion' of the IC technology or, in one embodiment, approximately 2 millimeters in width, and is raised compared to a central region 124 of wafer 110. The 'edge exclusion' of an IC technology is defined as the radial region outside of which chips are not used. In one embodiment, second material 120 includes a photoresist or an anti-reflective coating (ARC) and photoresist combination. In one embodiment, a positive photoresist is blanket deposited, and a light source is used to expose only central region 124 of the wafer. In an alternative embodiment, negative photoresist is used and the wafer edge is exposed. These processes result in cross-linking of only outer edge region 122, thus making it remain after the photoresists are developed. In an alternative, the photoresist may be developed such that it only is left on outer edge region 122 by appropriate use of a solvent strip of the photoresist in central region 124. As will be described in greater detail below, the thickness of second material 120 and width of outer edge region 122 may vary depending on first material 112 and details of the CMP process. As shown in FIGS. 3A-B, wafer 110 according to the disclosure includes substrate 111 having an upper surface of first material 112 to be incorporated into an integrated circuit (IC) on the substrate and an outer edge, raised region 122 of a second, sacrificial material 120. Second, sacrificial material 120 extends upwardly beyond first material 112 such that the first and second materials are non-coplanar. FIG. 3A shows an embodiment in which first material 112 is not etched back, and FIG. 3B shows an alternative embodiment in which first material 112 is also etched back, e.g., with a RIE or wet etch chemistry, to a depth less than the thickness of first material 112.

In one embodiment, first material 112 and second material 120 may be composed of silicon dioxide, either undoped or doped with one of the following: phosphorous (P), boron (B), fluorine (F), carbon (C) or hydrogen (H). In another embodiment, first material 112 may be composed of silicon dioxide, either undoped or doped with one of the following: phosphorous (P), boron (B), fluorine (F), carbon (C) or hydrogen (H), and second material 120 may be composed of a conductor comprising at least one of silicon (Si), tungsten (W), ruthenium (Ru), copper (Cu), tantalum (Ta), tantalum nitride (TaN) or titanium nitride (TiN). In one embodiment, first material 112 is a dielectric and second material 120 is a conductor; alternatively, in another embodiment, first material 112 is a conductor and second material 120 is a dielectric.

FIG. 4 shows performing chemical mechanical polishing (CMP) on wafer 110. The CMP may use any now known or later developed pad 114 and slurry combination appropriate for first material 112. As indicated, the presence of second material 120 (FIGS. 3A-B) at outer edge region 122 (FIGS. 3A-B) prevents an increased CMP rate and over polishing of that region. That is, the non-coplanarity of first material 112 and second material 120 diminishes over-polishing at an outer region 116 of wafer 110.

FIG. 5 shows wafer 110 after CMP and after second material 120 (FIGS. 3A-B and 4) removal. Second material 120 may be removed using any appropriate removal process. For example, where second material 120 includes a photoresist, the removal process may include using a solvent such as propylene glycol methyl ether acetate (PGMEA) on a track system such as those available from Tokyo Electron Limited (TEL), or a plasma resist strip using a downstream tool such as those available form Mattson, Axcelis, etc., or a parallel plate reactive ion etch (RIE) chamber such as those available from Lam, Applied Materials, TEL, etc.

As noted above, the thickness of second material 120 and width of outer edge region 122 may vary depending on first material 112. A number of examples are presented herein to illustrate different scenarios. In a first example, first material 112 may include a contact level dielectric such as BPSG, PSG or $SiO_2$ such as may occur between a first metal (M1) and a polyconductor (PC) level. In this case, the BPSG CMP removal of approximately 400 nanometers (nm) requires second material 120 in the form of a photoresist to be approximately 100-400 nm thick (prior to CMP) with outer edge region 122 having a width of approximately 1 mm. In a second example, first material 112 may include a conductor such as tungsten (W). In this example, tungsten CMP removal of approximately 300 nm requires second material 120 in the form of a photoresist to be approximately 100-300 nm thick (prior to CMP) with outer edge region 122 having a width of approximately 1 mm. In another example, first material 112 may include copper (Cu). In this example, copper CMP of approximately 1 um requires second material 120 in the form of photoresist to be approximately 300-1200 nm thick (prior to CMP) with outer edge region 122 approximately 1 mm in width. It is understood that an approximately 1 mm outer edge region 122 is a function of the CMP tool, first material 112 (e.g., W, Cu, $SiO_2$, etc.) and process, and the width needs to be optimized for a given process. In any event, outer edge region 122 has a width sufficient to raise CMP pad 114 (FIG. 4) and reduce the edge rate without degrading the CMP rate or non-uniformity in the active chip region and leaving increased film thickness 117 at the wafer edge.

Figure 6:
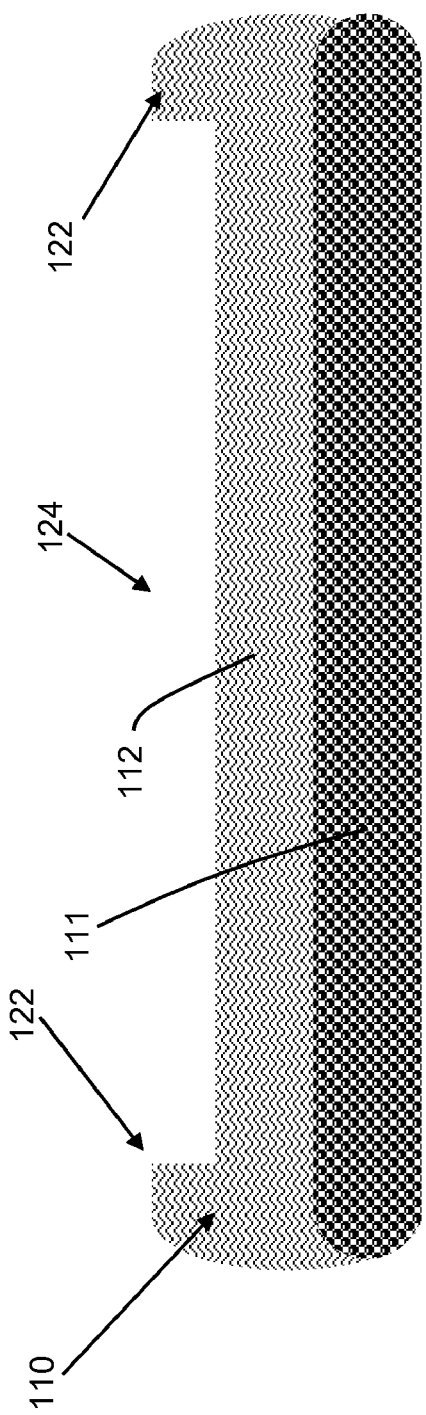
FIGS. 6-7 show one alternative embodiment of the process.
Figure 7:
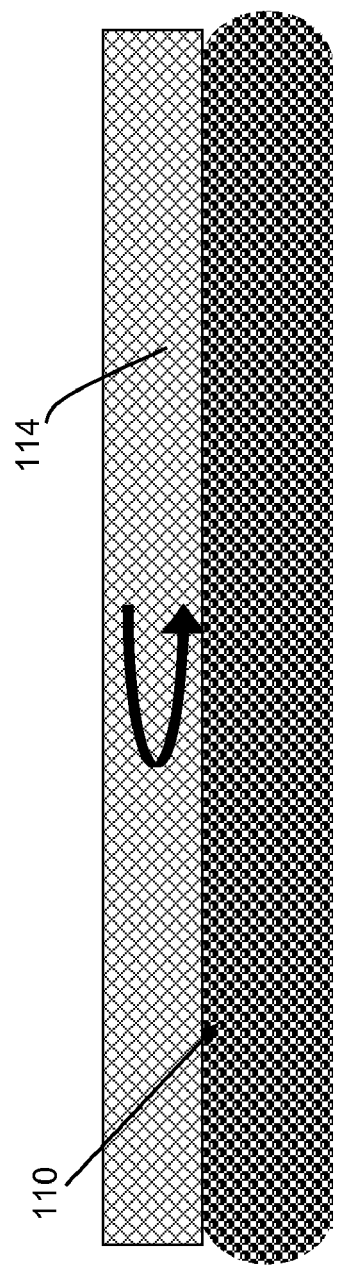

In addition to the above-described embodiments, a number of alternative embodiments may also be employed. In one alternative embodiment, first material 112 may include a dielectric such as PECVD $SiO_2$, and second material 120 may include a photoresist applied only to outer edge region 122. In this case, as shown in FIG. 3B, a wet or RIE etch may be performed on first material 112 to a depth less than a thickness of first material 112, followed by a photoresist strip, resulting in the structure shown in FIG. 6. CMP is then performed, as shown in FIG. 7.

In another alternative embodiment, first material 112 (dielectric or metal) may be deposited thicker than needed. Second material 120 in the form of a photoresist may then be applied to outer edge region 122, followed by a wet or RIE etch and a photoresist strip, as shown in FIG. 6. CMP is then performed, as shown in FIG. 7. In a third alternative embodiment, first material 112 (dielectric or metal) may be deposited. Second material 120 in the form of a photoresist may then be applied to outer edge region 122, followed by a blanket RIE etch in which the RIE non-uniformity is poor at outer edge region 122 with almost no removal at approximately 1 mm from the wafer's edge. This latter process also forms second material 120 as shown in FIG. 3B. CMP is then performed, followed by a dielectric or photoresist strip, if necessary. In another embodiment, first material 112 may be a dielectric and second material 120 may also be the substantially same dielectric, i.e., they are substantially the same.

Figure 8:
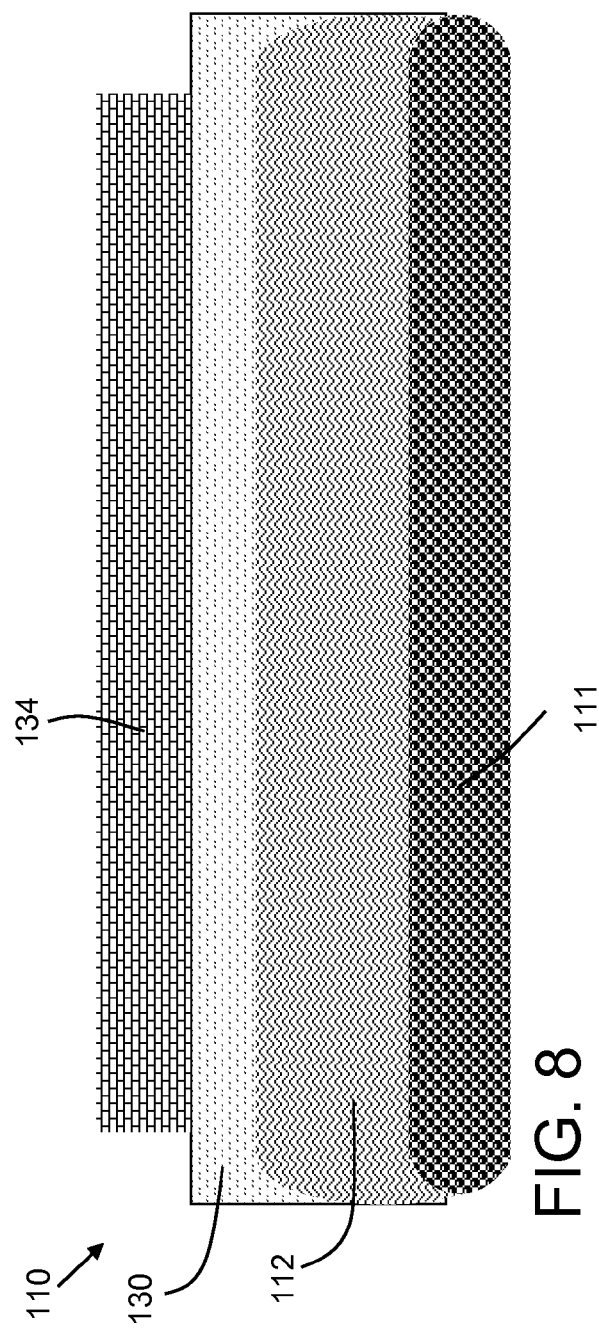
Figure 9:
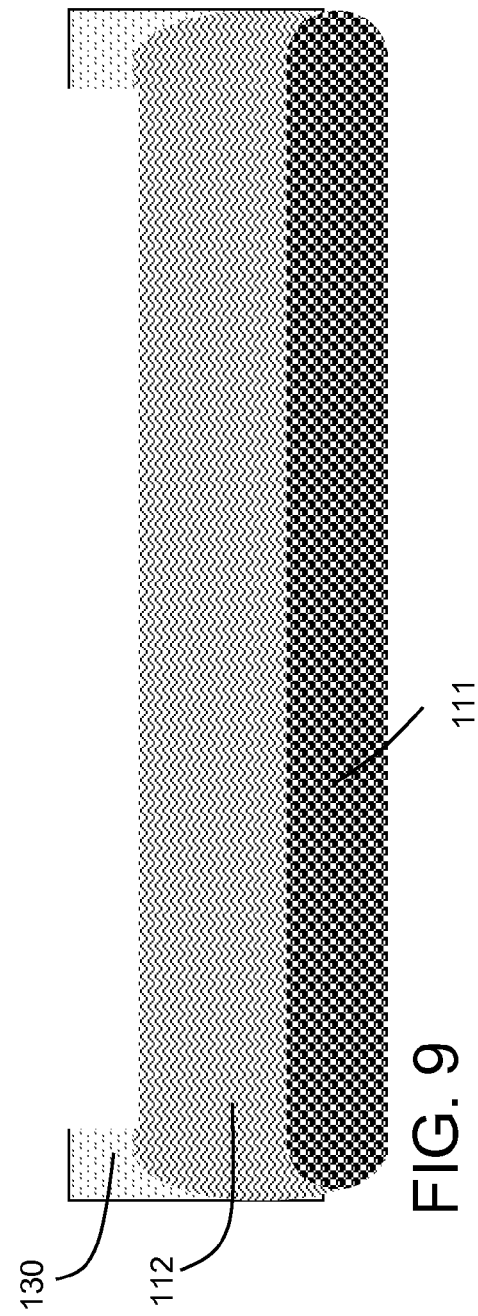

FIGS. 8-11 show another alternative embodiment. In this embodiment, a sacrificial, second material 130 is deposited on wafer 110 using any now known or later developed methods (e.g., CVD, PVD, etc.) after first material 112 is deposited. Sacrificial, second material 130 is not the same material as first material 112. For example, if first material 112 is a dielectric, then sacrificial, second material 130 could be, for example, amorphous silicon. Alternatively, if first material 112 is phospho-silicate glass (PSG), then sacrificial, second material 130 could be silicon oxide ($SiO_2$). As also shown in FIG. 8, a photoresist layer 134 may then be applied over sacrificial layer 130. As shown in FIG. 9, sacrificial, second material 130 is etched and photoresist layer 134 (FIG. 8) is stripped or removed. FIGS. 10-11 show wafer 110 during (FIG. 10) and after (FIG. 11) CMP, during which first material 112 and sacrificial, second material 130 (FIG. 9) is removed. In an alternative embodiment (not shown), a portion of sacrificial, second material 130 may remain on an edge of wafer 110 after CMP and is either removed in an etch process selective to first material 120 or is left on the wafer.

The methods described above may be used with practically any Damascene wiring level process. For example, the methods may be employed relative to the following copper BEOL processes: a) a BPSG, $SiO_2$, or PSG dielectric polish using CMP of the pre-first metal (M1) dielectric, b) tungsten (W) CMP of a contact level between M1 and a polyconductor or active region, c) copper (Cu) wiring levels M1, M2, M3, etc., d) fluorinated silica glass (FSG), hydrogenated silicon oxycarbide (SiCOH), or $SiO_2$ dielectric planarization over radio frequency complementary metal oxide semiconductor (rf-CMOS) or analog and mixed signal CMOS passive elements (e.g., MIM capacitors, thin film resistor, etc.), e) Cu seed CMP performed prior to Cu plating (used to form super thick inductors), f) gold (Au) CMP used to form MEMS structures above a last aluminum-copper (AlCu) wiring level. In addition to above, the methods may also be employed relative to other aluminum-copper BEOL processes such as: tungsten CMP of vias, or FSG, SiCOH, or $SiO_2$ dielectric planarization prior to via processing. The above lists are only illustrative, and other wiring level processes may employ the teachings of the disclosure.

Figure 12:
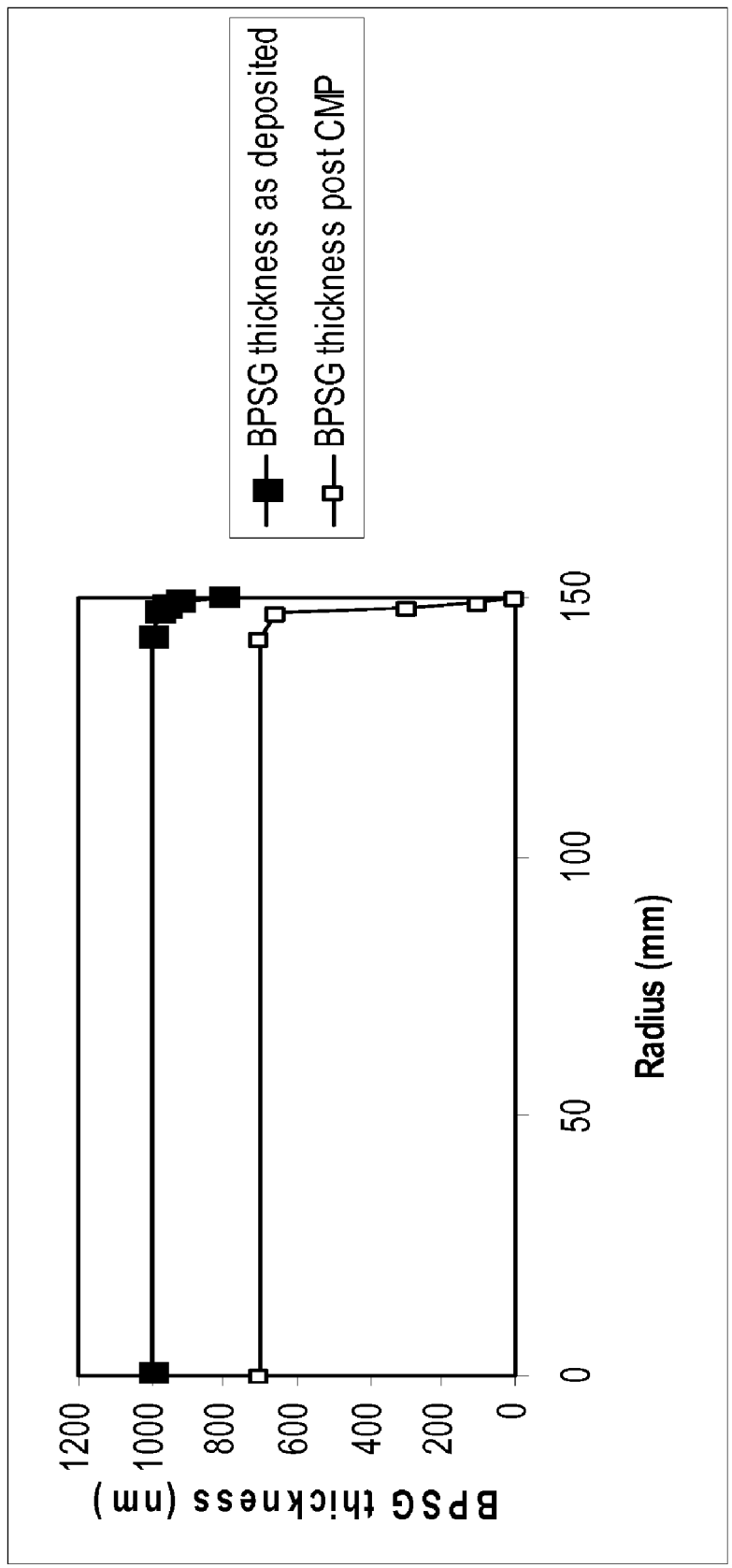
FIG. 12 shows a graph illustrating a film thickness at different radii of a 300 mm wafer before and after a conventional CMP process.

FIG. 12 shows a graph illustrating a film thickness at different radii of a 300 mm wafer before and after a conventional CMP process. The table below shows the data used to generate the graph, and also data for a simulated result using the present disclosure (not shown in graph since it would be a substantially straight line). As shown in the far right column of the table, film thickness is substantially uniform across the 300 mm wafer after CMP in contrast to after the conventional CMP (middle column).

| Radius (mm) | As deposited BPSG Thickness (nm) | BPSG thickness Post-CMP (conventional) (nm) | BPSG thickness Post-CMP (disclosure) (nm) |
| --- | --- | --- | --- |
| 0 | 1000 | 700 | 700 |
| 142 | 1000 | 700 | 700 |
| 147 | 980 | 660 | 660 |
| 148 | 960 | 300 | 620 |
| 149 | 920 | 100 | 580 |
| 150 | 800 | 0 | 500 |

The methods and wafer as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   providing a wafer;
   forming a first material across the wafer;
   forming a second material at an outer edge region of the wafer, leaving a central region of the wafer devoid of the second material; and
   performing chemical mechanical polishing (CMP) on the wafer.

2. The method of claim 1, wherein the outer edge region is less than approximately 2 millimeters in width.

3. The method of claim 1, wherein the first material is substantially the same as the second material.

4. The method of claim 1, wherein the first material and the second material are composed of silicon dioxide, either undoped or doped with one of the following: phosphorous (P), boron (B), fluorine (F), carbon (C) or hydrogen (H).

5. The method of claim 1, wherein the first material is composed of silicon dioxide, either undoped or doped with one of the following: phosphorous (P), boron (B), fluorine (F), carbon (C) or hydrogen (H), and the second material is composed of a conductor comprising at least one of silicon (Si), tungsten (W), ruthenium (Ru), copper (Cu), tantalum (Ta), tantalum nitride (TaN) or titanium nitride (TiN).

6. The method of claim 1, wherein the first material is a dielectric and the second material is a conductor.

7. The method of claim 1, wherein the first material is a conductor and the second material is a dielectric.

8. The method of claim 1, further comprising removing the second material from the outer edge region after the CMP performing.

9. The method of claim 1, wherein the second material includes a photoresist.

10. The method of claim 9, wherein the second material further includes an anti-reflective coating (ARC) material.

11. The method of claim 1, wherein the second material forming includes depositing the second material and a photoresist layer on the second material and etching the photoresist and the second material, leaving the central region devoid of the second material.

12. The method of claim 1, wherein the first material includes at least one of the following: a dielectric or a conductor.

13. A method comprising:

providing a wafer;

forming a first material across the wafer;

forming a photoresist at an outer edge region of the wafer that is less than approximately 2 millimeter in width, leaving a central region of the wafer devoid of the photoresist;

performing chemical mechanical polishing (CMP) on the wafer; and removing the photoresist from the outer edge region.

14. The method of claim 13, wherein the first material is substantially the same as the photoresist.

15. The method of claim 13, wherein the first material is different than the photoresist.

16. The method of claim 13, further comprising forming an anti-reflective coating (ARC) material at the outer edge region of the wafer, leaving the central region of the wafer devoid of the ARC material.

17. The method of claim 13, wherein the photoresist removing occurs prior to the CMP performing such that the photoresist etches the first material to a depth less than a thickness of the first material.

18. The method of claim 13, wherein the photoresist removing occurs after the CMP performing.

19. The method of claim 13, wherein the first material includes at least one of the following: a dielectric or a conductor.

* * * * *